(12) United States Patent
Kagan

(10) Patent No.: US 9,696,180 B2
(45) Date of Patent: Jul. 4, 2017

(54) PORTABLE POWER QUALITY ANALYZER WITH NETWORKING CAPABILITIES

(75) Inventor: Andrew Kagan, Great Neck, NY (US)

(73) Assignee: Electro Industries/Gauge Tech., Westbury, NY (US)

( * ) Notice: Subject to any disclaimer, the term of this patent is extended or adjusted under 35 U.S.C. 154(b) by 1021 days.

(21) Appl. No.: 12/197,341

(22) Filed: Aug. 25, 2008

(65) Prior Publication Data

US 2008/0312851 A1   Dec. 18, 2008

Related U.S. Application Data

(63) Continuation of application No. 11/998,920, filed on Dec. 3, 2007, which is a continuation of application No. 10/969,706, filed on Oct. 20, 2004, now Pat. No. 7,304,586.

(51) Int. Cl.
*G08B 23/00*  (2006.01)
*G01D 4/00*   (2006.01)
*G01R 19/25*  (2006.01)
*G06Q 50/06*  (2012.01)

(52) U.S. Cl.
CPC ......... *G01D 4/002* (2013.01); *G01R 19/2513* (2013.01); *G06Q 50/06* (2013.01); *Y02B 90/241* (2013.01); *Y02B 90/243* (2013.01); *Y04S 20/32* (2013.01); *Y04S 20/325* (2013.01)

(58) Field of Classification Search
CPC .................................. H01Q 7/00; H01Q 1/22
USPC ................ 340/870.02–870.03; 343/867
See application file for complete search history.

(56) References Cited

U.S. PATENT DOCUMENTS

| | | | |
|---|---|---|---|
| 1,863,741 A * | 6/1932 | Bouthillon | 343/867 |
| 2,292,163 A * | 8/1942 | Shea | 455/193.1 |
| 5,574,654 A | 11/1996 | Bingham et al. | |
| 5,801,643 A | 9/1998 | Williams et al. | |
| 5,874,903 A | 2/1999 | Shuey et al. | |
| 5,898,387 A | 4/1999 | Davis et al. | |
| 5,978,655 A * | 11/1999 | Ohura et al. | 455/41.1 |
| 5,986,574 A | 11/1999 | Colton | |
| 6,011,519 A * | 1/2000 | Sadler et al. | 343/742 |
| 6,073,169 A | 6/2000 | Shuey et al. | |
| 6,100,817 A | 8/2000 | Mason et al. | |
| 6,396,839 B1 | 5/2002 | Ardalan et al. | |
| 6,437,692 B1 | 8/2002 | Petite et al. | |
| 6,657,552 B2 | 12/2003 | Belski et al. | |
| 6,751,563 B2 | 6/2004 | Spanier et al. | |
| 6,836,737 B2 | 12/2004 | Petite et al. | |

(Continued)

OTHER PUBLICATIONS

The Dranetz Field Handbook for Power quality Analysis; Dranetz Technologies Incorporated, Edison, NJ; Copyright 1991; pp. 1-271.

(Continued)

*Primary Examiner* — Albert Wong
(74) *Attorney, Agent, or Firm* — Gerald E. Hespos; Michael J. Porco; Matthew T. Hespos

(57) ABSTRACT

An intelligent electronic device (IED) for monitoring power quality of electrical services and receiving/transmitting information using a wireless and wired communication protocol is disclosed. The IED may be configured as a terminal or server of a Wi-Fi network, a cellular network, Intranet, LAN, WAN, or the Internet. In one application, these techniques are implemented in IEDs such as portable power quality analyzers.

12 Claims, 10 Drawing Sheets

(56) References Cited

U.S. PATENT DOCUMENTS

| | | |
|---|---|---|
| 6,900,738 B2 | 5/2005 | Crichlow |
| 6,985,087 B2 | 1/2006 | Soliman |
| 7,043,459 B2 | 5/2006 | Peevey |
| 7,049,975 B2 | 5/2006 | Vanderah |
| 7,050,808 B2 | 5/2006 | Janusz et al. |
| 7,196,673 B2 * | 3/2007 | Savage et al. ............... 343/719 |
| 7,304,586 B2 | 12/2007 | Wang et al. |
| 2007/0096942 A1 * | 5/2007 | Kagan et al. ............ 340/870.02 |

OTHER PUBLICATIONS

Power Platform 4300 Multi-DAQ TASKCard Operator's Manual; Dranetz-BMI, Original Issue—Jul. 2002, pp. 1-203.

Power Platform PP1 & PP1E TASKCard-Inrush Operator's Manual; Dranetz-BMI, Revision A—Apr. 15, 1997, pp. 1-231.

PDA 1252 Portable Analyzer, Installation & Operation Manual; Electro Industries/Gauge Tech; Version 1.01, Jul. 14, 2005; pp. 1-136.

PDA 1252 Watertight Portable Power Quality Analyzer, Brochure; Electro Industries/Gauge Tech; Dec. 23, 2005; pp. 1-4.

\* cited by examiner

PORTABLE POWER QUALITY ANALYZER WITH NETWORKING CAPABILITIES

FIELD OF THE INVENTION

The present disclosure relates generally to the field of intelligent electronic devices for electrical utility services and, more specifically, to digital power quality analyzers for the electrical utility services.

BACKGROUND OF THE INVENTION

Electrical utilities gradually replace traditional means for managing and controlling the quality of electrical power provided to industrial and residential customers with intelligent electronic devices (IEDs), such as digital electric power quality analyzers, electronically-controlled Remote Terminal Units (RTUs), protective relays, fault recorders, and the like.

Increasingly, power quality is becoming an important issue in power monitoring. The sensitivity of today's electronic equipment make them susceptible to power disturbances. For some devices, a momentary disturbance can cause scrambled data, interrupted communications, a frozen mouse, system crashes and equipment failure. Furthermore, power quality issues cause businesses problems such as lost productivity, idle people and equipment, lost transactions and overtime required to make up for lost work time.

In operation, conventional IEDs provide a broad nomenclature of monitoring functions. However, there is still a need for IEDs capable of monitoring power quality parameters and, in operation, being wirelessly connectible to communication networks. Therefore, further improvements in the IEDs would be desirable.

SUMMARY

One aspect of the present disclosure provides an intelligent electronic device (IED), such as a power quality analyzer, configured for monitoring waveforms of voltages and currents of electrical services and wirelessly receiving/transmitting information over communication networks using at least one wireless communication protocol. The IED may be configured as a terminal or a server of a network, such as a Wi-Fi network, cellular network, Intranet, LAN, WAN, or the Internet.

In another aspect of the present disclosure, a portable power quality analyzer is provided. The portable power quality analyzer of the present disclosure measures and records power usage and quality in, for example, remote or temporary locations making it ideal for load surveys, monitoring transformer banks and indoor and outdoor electrical monitoring.

In a further aspect, a portable power quality analyzer provides a portable enclosure having a field openable upper cover for gaining access to internal components, the portable enclosure including at least one voltage connection and at least one current connection accessible from an outer surface of the portable enclosure; an input module coupled to the at least one voltage and current connections configured for monitoring waveforms of voltages and currents of electrical services; a processing module configured for processing the waveforms and determining power quality events; a user interface module disposed internal to the portable enclosure and accessible when the upper cover is open; and a communication module configured for transmitting/receiving information to/from the portable power quality analyzer using at least one wireless communication protocol. In one aspect, the portable power quality analyzer includes a wound flat coil antenna disposed on the upper cover and coupled to the communication module.

According to another aspect of the present disclosure, a power monitoring system is provided. The power monitoring system includes a plurality of portable power quality analyzers communicating over an ad hoc network; a base unit for coupling the ad hoc network to another second network; each of the portable power quality analyzers including a portable enclosure having a field openable upper cover for gaining access to internal components, the portable enclosure including at least one voltage connection and at least one current connection accessible from an outer surface of the portable enclosure; an input module coupled to the at least one voltage and current connections configured for monitoring waveforms of voltages and currents of electrical services; a processing module configured for processing the waveforms and (determining power quality events; a user interface module disposed internal to the portable enclosure and accessible when the upper cover is open; a communication module configured for transmitting/receiving information to/from the portable power quality analyzer using at least one wireless communication protocol; and a signal strength indicator for determining the signal strength of the wirelesses connection between each portable power quality analyzer and the base unit, wherein the power quality analyzer with a highest signal strength is configured as a server and the remaining portable power quality analyzers are configured as clients.

Various aspects and embodiments of the disclosure are described in further detail below.

The Summary is neither intended nor should it be construed as being representative of the full extent and scope of the present disclosure, which these and additional aspects will become more readily apparent from the detailed description, particularly when taken together with the appended drawings.

Figure 1:
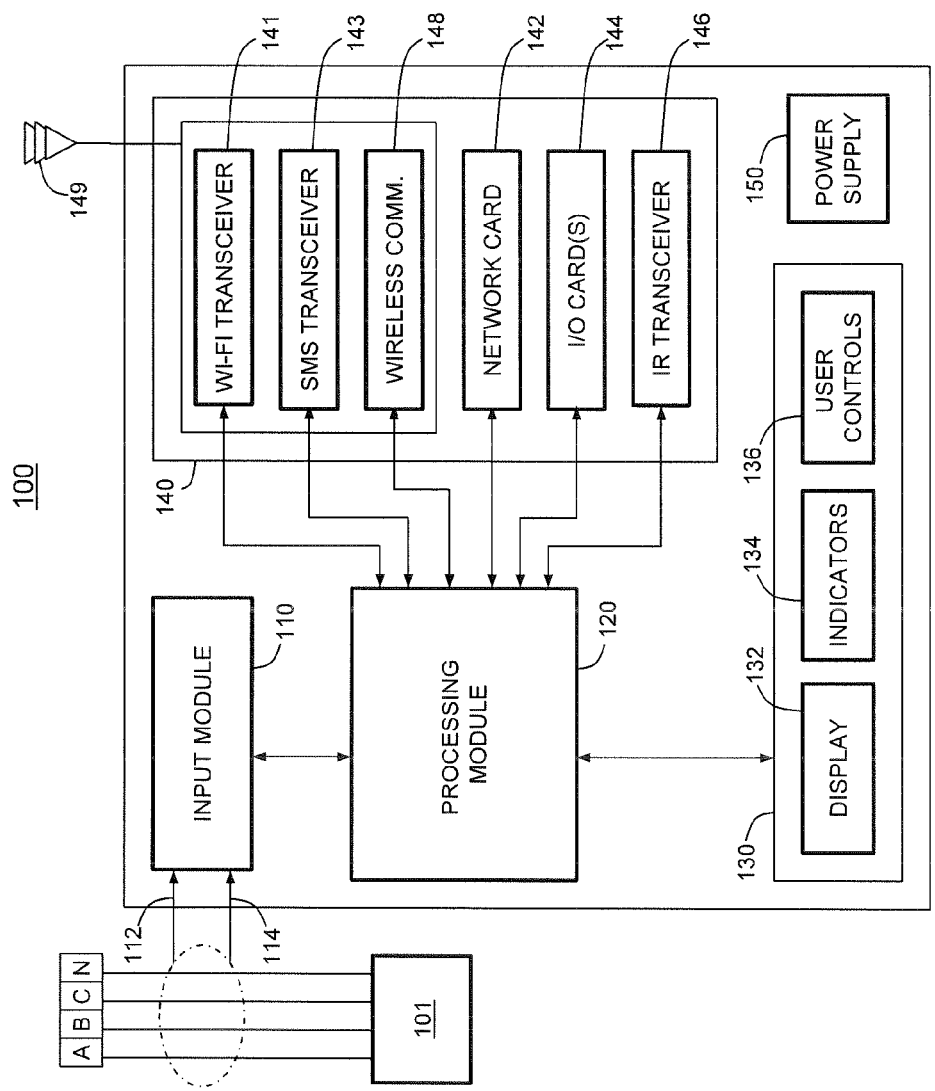
FIG. 1 depicts a schematic diagram of an exemplary IED, e.g., power quality analyzer, in accordance with one embodiment of the present disclosure.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as power quality analyzers, including portable and accuracy certifiable power quality analyzers. The term "power quality analyzers" is broadly used herein in reference to IEDs adapted to record, measure, and communicate at least some of parameters of waveforms of voltages and currents of a respective electrical service, including their harmonics, transients, ripples, and other disturbances. The term "portable" is used in reference to the power quality analyzers to denote transportability of such IEDs and ability thereof for momentarily, temporary, and permanent connectivity to respective electrical services and communication networks.

It will be appreciated by those skilled in the art that the disclosure may also be utilized within the context of other IEDs, including Programmable Logic Controllers (PLC's), Remote Terminal Units (RTUs), protective relays, fault recorders, and meters, among other devices or systems used to manage and control quality, distribution, and consumption of electrical power.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

FIG. 1 depicts a schematic diagram illustrating an exemplary power quality analyzer (referred to hereafter as "PQ analyzer") 100. The PQ analyzer 100 generally comprises an input module 110, a processing module 120, an optional user interface unit 130, a communications module 140, and a power supply 150. In operation, the PQ analyzer 100 determines power quality parameters of electrical services 101. The power supply 150 of the PQ analyzer 100 may be coupled to the power lines of the electrical services 101 or, alternatively, to an independent source of power.

The PQ analyzer 100 is operable to monitor, calculate, and analyze at least some of voltage/current fault signatures, voltage surges and sags, voltage flickers, neutral-to-ground voltage fluctuations, voltage/current harmonics and interharmonics, voltage/current total harmonic distortion (THD), voltage/current transient events and sub-cycle transient events, i.e., power quality events. It is to be appreciated that this listing of power quality events is not exhaustive and other types of events and/or disturbances may be classified as power quality events. The PQ analyzer 100 also will determine real power, reactive power, total power, and power factors, among other parameters of particular electrical services 101. In alternate embodiment, additionally or alternatively, the PQ analyzer 100 may also be configured to determine line/phase voltages and currents or root mean square (RMS) values thereof, as well as calculate energy or revenue.

In operation, the PQ analyzer 100 performs automatic accuracy calibrations and temperature compensations and may be programmed (i.e., configured) for time stamping of collected data, accumulating the data during pre-scheduled time intervals and/or per an event-triggered schedule, reporting the data with pre-scheduled periodicity, as well as for storing, displaying, and transmitting pre-event and post-event portions of waveforms of monitored voltages and currents of the electrical services 101.

In the depicted embodiment, power lines of the electrical services 101 illustratively include phase lines A, B, and C and a neutral line N, which are coupled to the PQ analyzer 100 using voltage interface 112 and current interface 114. Some methods of coupling digital electrical power and energy meters to electrical services are described in detail in commonly assigned U.S. Pat. No. 7,271,996. For example, in specific embodiments, the electrical services 101 may have custom wiring configurations, for example, single-phase, dual-phase, Wye, Delta, or multi-phase wiring configurations, as well as include DC electrical services. Additionally or alternatively, the electrical services 101 may include pluralities of sub-sets of phase lines and/or subsets including phase and neutral lines. In yet other embodiments, at least a portion of the power lines may be represented by voltage/current wiring pairs forming the interfaces 112, 114.

Figure 2:
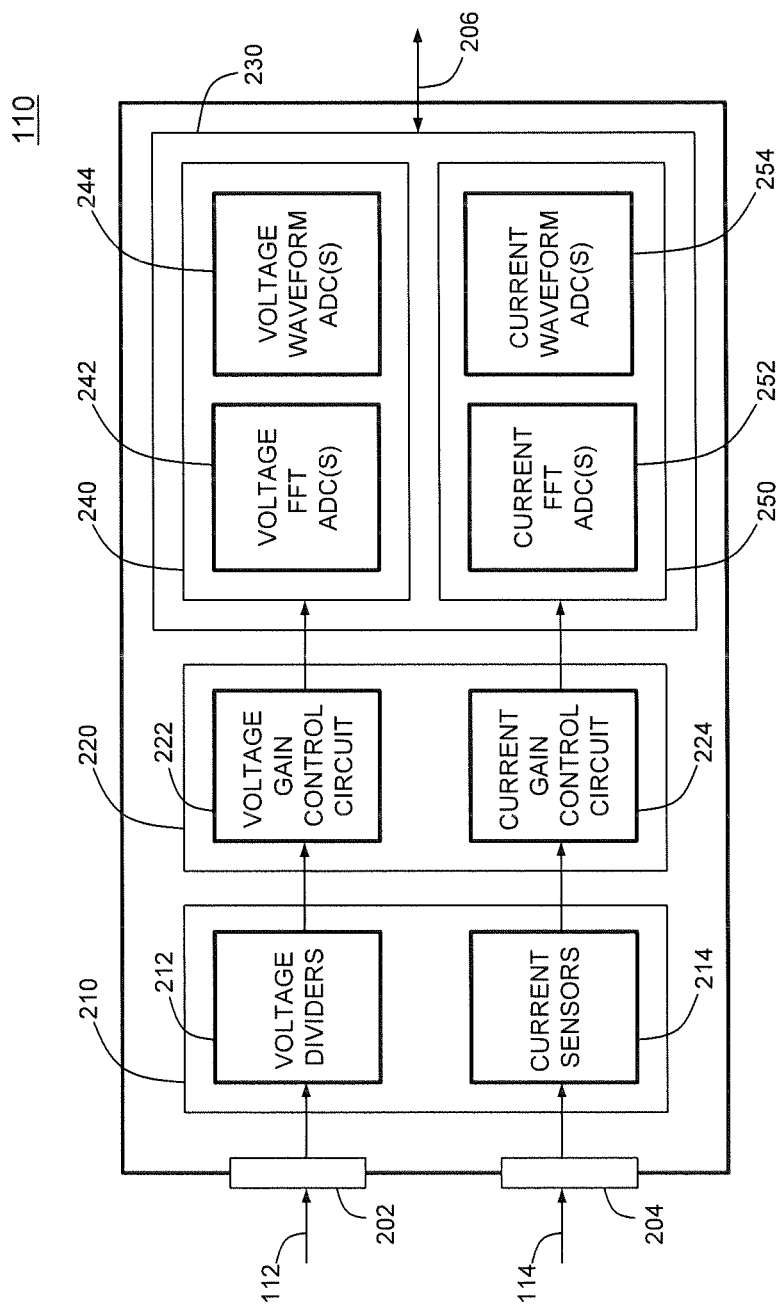
FIG. 2 is a high-level block diagram of an input module of the power quality analyzer of FIG. 1.

Referring to FIG. 2, in one exemplary embodiment, the input module 110 comprises a voltage input terminal 202, a current input terminal 204, sensing circuits 210 including voltage dividers 212 and current sensors 214, an optional multi-channel gain control unit 220 including voltage (222) and current (224) gain control circuits (GCCs), and a digitizing unit 230.

Using the input terminals 202 and 204, the input module 110 is coupled to the voltage and current interfaces 112 and 114 of the electrical service 101. The voltage inputs 112 and the current inputs 114 are selectively connected to voltage dividers 306 and current sensors 308, respectively. Output signals of the voltage dividers 212 and current sensors 214 are selectively provided to inputs of the voltage GCC 222 and current GCCs 224 optimizing gain factors of the output signals.

In the digitizing unit 230, waveforms of the gain-optimized analog output signals of the voltage dividers 212 and current sensors 214 are digitized using analog-to-digital converters (ADCs). In one embodiment, the digitizing unit 230 comprises a voltage digitizing module 240 and a current digitizing module 250. The modules 240, 250 include blocks of ADCs selectively used in Fast Fourier Transform (FFT) analysis (ADCs 244, 252) and waveform analysis (ADCs 244, 254) of the monitored voltages (ADCs 242, 244) and currents (ADCs 252, 254) of the electrical services 101. Typically, each of these blocks of ADCs includes dedicated devices selectively performing, in real time, digitizing of particular voltage and current waveforms. The digitized voltage/current waveforms are transferred, via serial or parallel interface 206 (for example, Serial Peripheral Interface (SPI)), to the processing module 120.

Generally, a sampling rate of the ADCs 242 and 252 is in range from about 12 to 36 KHz, which corresponds to about 200-600 data points per a cycle of a voltage/current waveform at the AC frequency of 60 Hz. In one exemplary embodiment, the sampling rate of the ADCs 242 and 252 is about 26 KHz, and a sampling rate of the ADCs 244 and 254 is up to 10 MHz. Such a high sampling rate of the ADCs 244 and 254 allows performing in the PQ analyzer 100 extensive high-resolution data processing and analysis of transients in the monitored voltages and currents.

Figure 3:
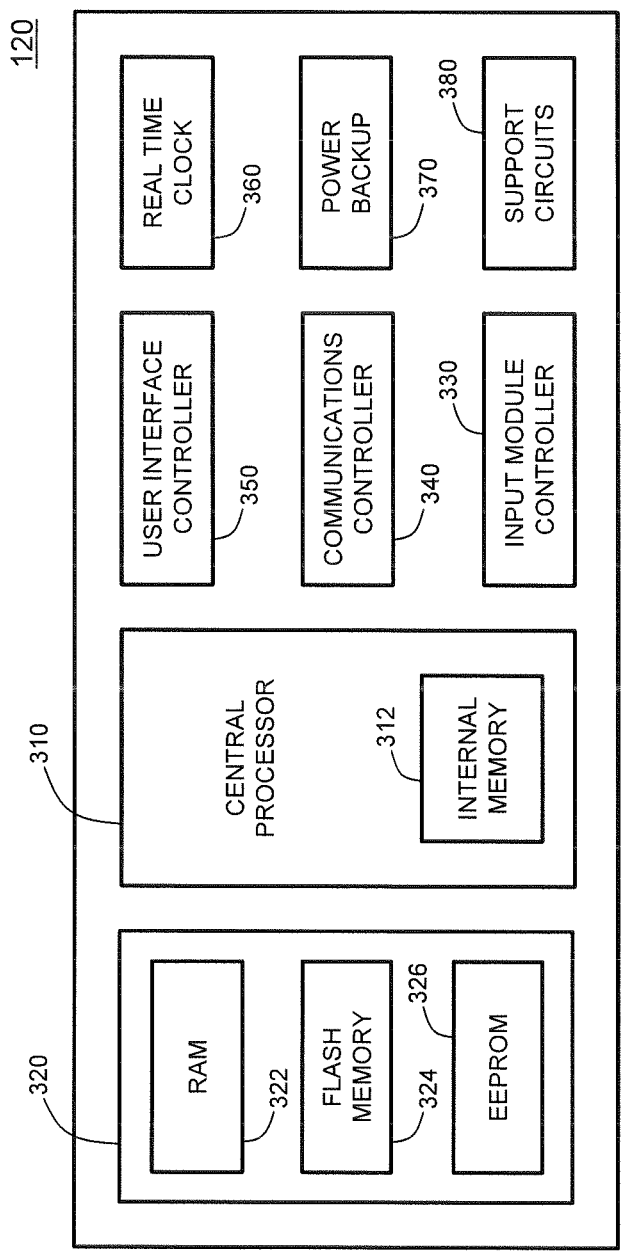
FIG. 3 is a high-level block diagram of a processing module of the power quality analyzer of FIG. 1.

Referring to FIG. 3, in one exemplary embodiment, the processing module 120 comprises a central processor 310 having an internal memory 312, a memory module 320, an input module controller 330, a communications controller 340, a user interface controller 350, a real time clock 360, a power backup 370, and support circuits 380.

In the depicted embodiment, the memory 320 illustratively includes a RAM 322, a flash memory 324, and an EEPROM 326. Non-volatile portions of the memory 320 contain codes of programs and software modules that, together, support various functions of the PQ analyzer 100. Such functions generally include execution of various power quality related measurements and calculations and facilitation of user interface and wireless/wired connectivity of the PQ analyzer 100. In one embodiment, the memory 320 contains code of a program that configures the PQ analyzer 100 to operate as a terminal or a server of a Wi-Fi network, a cellular network, an Intranet, a local area network (LAN), a wide area network (WAN), or the Internet.

Referring back to FIG. 1, the user interface unit 130 generally includes a front panel display 132 (e.g., liquid crystal display (LCD) or plasma display), indicators 134 (e.g., LED indicators), and user controls 136. The user controls 136 may include pushbuttons that allow to select particular data for being shown on the display 132, select/modify configuration settings of the PQ analyzer 100, or review status messages generated by the PQ analyzer. In one embodiment, the user interface unit 130 includes a touch-screen display 132, which may be used to review and/or modify configuration settings of the PQ analyzer 100. Alternatively or additionally, such operations may be performed via the communication module 140 or using the user controls 136.

In the depicted embodiment, the communications module 140 comprises a Wi-Fi transceiver 141, an optional Short Massaging Service (SMS) transceiver 143, and optional network communication device 142, input/output (I/O) card(s) 144, infra-red (IR) transceiver 146, and wireless communication device 148, and a transmit/receive antenna 149 selectively coupled to the transceivers 141, 143 and communication device 148.

Generally, a format of incoming portions of the information comprises a field for a pre-defined address of the PQ analyzer 100, a field for an address of a sending party, and a field for a command. Correspondingly, a format of outgoing portions of the information comprises a field for an address of an intended receiving party, a field for an address of the PQ analyzer 100, and a field for outgoing data. Both the incoming and outgoing portions of the information may be password-protected or encrypted.

Using the communication module 140, the PQ analyzer 100 can transmit and receive information formatted using one or more standard data protocols. For example, the communication module 140 may be configured to transmit/receive information using the Hypertext Transfer Protocol (HTML), the File Transfer Protocol (FTP), or the Extensive Markup Language (XML) Protocol, as well as perform real-time conversions between these protocols.

The outgoing information generally comprises present or historic raw or systemized data, alarms, text/symbolic messages, charts, and bar graphs. Correspondingly, examples of the incoming information may include PQ analyzer's configuration settings, requests for data or status information, and the like. In some embodiment, the PQ analyzer 100 may produce information in a form of web pages allowing access to particular portions of the data or configuration settings of the PQ analyzer. Both the incoming and outgoing information may be in a form of email messages.

In operation, configuration settings and procedures executed by the PQ analyzer 100 are wirelessly upgradeable via the WI-Fi transceiver 141, SMS transceiver 141, and/or wireless communication device 148.

Figure 4:
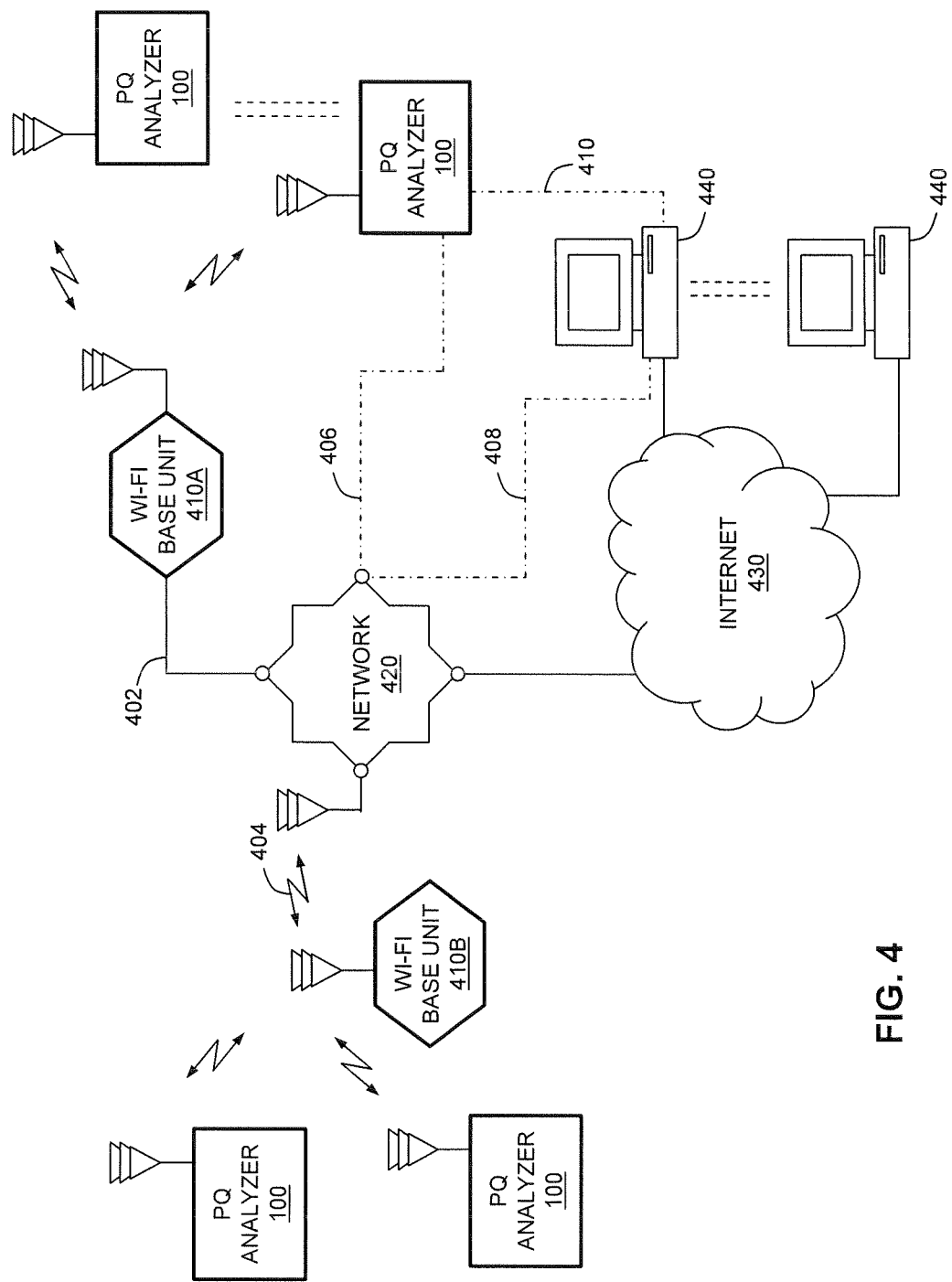
FIG. 4 is a schematic diagram illustrating connectivity and networking features of the power quality analyzer of FIG. 1 in accordance with one embodiment of the present disclosure.

Referring to FIG. 4, the Wi-Fi transceiver 141 provides the PQ analyzer 100 with wireless transmission and reception capabilities commonly referred to as Wi-Fi, or IEEE 802.11.X connectivity, wherein X denotes a version of the communication standard IEEE 802.11. Using the Wi-Fi transceiver 141, the PQ analyzer 100 can be communicatively connected to a local Wi-Fi base unit 410. The Wi-Fi base unit 410 may be connected to a network 420 (for example, Intranet, LAN, or WAN) using a wired interface 402 (Wi-Fi base unit 410A) or a wireless interface 404 (Wi-Fi base unit 410B).

The network 420 is communicatively coupled to the Internet 430. In operation, via the Internet 430, the PQ analyzer 100 is accessible by users 440, such as service/line personnel of utility companies providing electric services 101 or owners of loads which voltages and currents are monitored using the PQ analyzer 100. In one embodiment, the Dynamic Host Configuration Protocol (DHCP) may be used to assign Internet addresses to the PQ analyzer 100.

In some embodiments, additionally or alternatively, the users 440 may also access the PQ analyzer 100 via the network 420 (shown, in phantom, with a link 406) or directly via the I/O card(s) 144 and/or the IR transceiver 146 (shown, in phantom, with a link 408). Via the network 420 and Internet 430, the PQ analyzer 100 may simultaneously exchange information (e.g., data, alarms, etc.) with a plurality of the users thereof using communication protocols and formats discussed above in reference to the communication module 140 and, in particular, using e-mail formats.

In one embodiment, a plurality of PQ analyzers 100 are employed to create an ad hoc network for power monitoring. In this embodiment, one of the plurality of PQ analyzers 100 is configured as a server to collect data from the other PQ analyzers 100 and to serve this collected information over a different network, e.g., the Internet. In one embodiment, the ad hoc network is self-configuring and each PQ analyzers 100 will include a wireless connection signal strength indictor. Based on the strength of the wireless connection, the plurality of PQ analyzers 100 will communication with each other and determine which PQ analyzer 100 has the highest signal strength to a base unit, e.g., WFI base unit 410B, and will select the PQ analyzer 100 with the highest signal strength as the server. The remaining PQ analyzers 100 will be terminals or client of the ad hoc network. This will ensure reliability of the network so if a PQ analyzer 100 will low signal strength continuously "falls off" the network only that terminal or client will be lost and not the whole network as in the case where the PQ analyzer 100 with the lowest signal strength is the server. The ad hoc network of PQ analyzers 100 will be beneficial for temporarily setting up a network in a facility to determine locations and causes of power quality events and disturbances.

Figure 5:
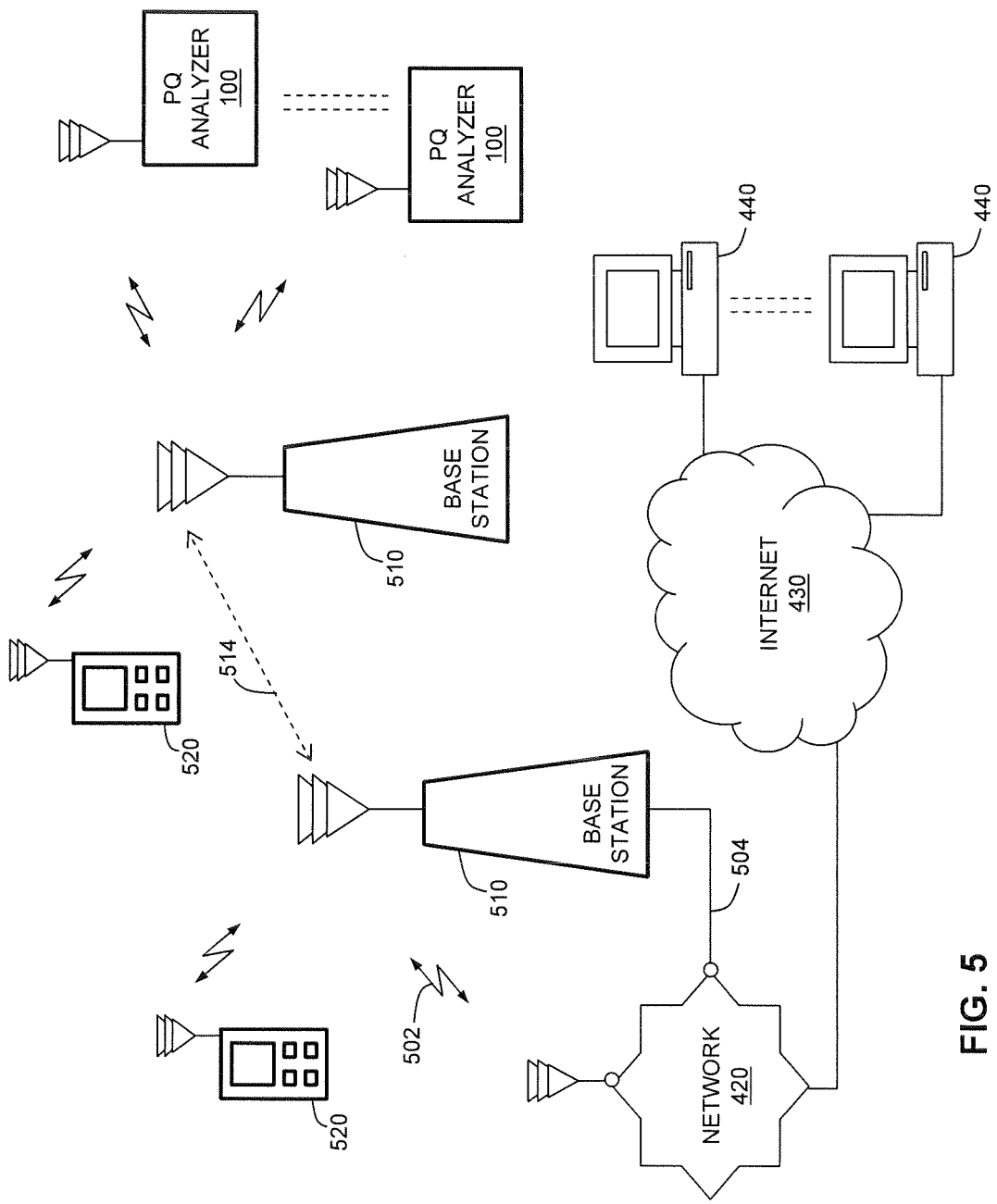
FIG. 5 is a schematic diagram illustrating connectivity and networking features of the power quality analyzer of FIG. 1 in accordance with another embodiment of the present disclosure.

Referring to FIG. 5, the SMS transceiver 143 provides the PQ analyzer 100 with wireless connectivity via regional cellular networks. Typically, due to size limitations of SMS transmissions, in incoming/outgoing SMS messages at least a portion of commands and data is presented in pre-defined coded formats, and different such formats may be used in communications with particular users of the PQ analyzer 100.

Using the SMS transceiver 143, the PQ analyzer 100 is communicatively connected to a base station(s) 510 of a regional cellular network. The base stations 510 may be connected to the network 420 via wireless and/or wired interfaces 502, 504. In this embodiment, the PQ analyzer 100 is assigned a cellular phone number and, via the respective base station 510, is communicatively accessible by user of cellular phones 520. The PQ analyzer 100 may selectively transmit/receive information (e.g., data or alarms) to/from users of particular cellular phones 520, for example, to/from traveling users 440 (discussed above in reference to FIG. 4).

Referring back to FIG. 1, the wireless communication device 148 may include Bluetooth™ connectivity, satellite connectivity, as well as interfaces to wireless systems employing spread-spectrum techniques, ZigBee systems (i.e., systems compliant with the IEEE 802.15.4 standard for wireless personal area networks wireless (WPANs)), or mesh-enabled communication systems.

The network communication device 142 provides connectivity between the PQ analyzer 100 and wired networks (for example, via a hardware/software modem or network interface card (NIC)) and, structurally, includes one or more specialized cards or modules. In one embodiment, the network communication device 142 supports the TCP/IP and 10/100Base-T Ethernet communication protocols and, optionally, at least one of the Modbus, Modbus/TCP, Distributed Network Protocol (DNP) (e.g., DNP 3.0), RS-485, and RS-232 communication protocols. In some embodiments, the network communication device 142 may be used for operations otherwise performed in the PQ analyzer 100 using the Wi-Fi transceiver 141 or SMS transceiver 143.

Correspondingly, the I/O cards 144 selectively provide to remote users of the PQ analyzer 100 industry-standard 0-1 mA interface, 4-20 mA current loop interface, and digital ON/OFF input/output contacts, and the IR I/O transceiver 146 supports optical communications with IR-enabled devices, such as Personal Digital Assistants (PDAs), laptops, and the like.

The network communication device 142 and the I/O cards 144, 146 are generally coupled to the processing module 120 using serial interfaces, for example, DNP, Modbus, Serial Peripheral Interface (SPI), RS-232, or RS-485 interfaces. The PQ analyzer 100 may be configured to include up to two of the same or different I/O cards (i.e., printed circuit boards (PCBs)) 144. The physical connections may include, but not limited to, cabling (e.g., parallel or serial cables, including RS-232, RS-485, USB, and Firewire (IEEE-1394) Ethernet, Fiber Optic, or Fiber Optic over Ethernet cables, and appropriate port configurations.

Figure 6:
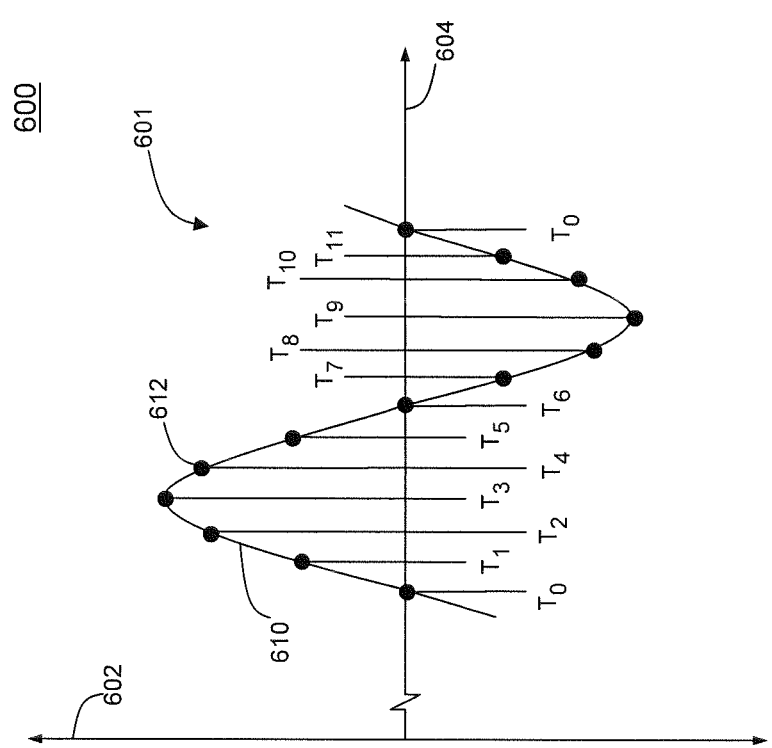
FIG. 6 is a timing diagram illustrating techniques for waveform sampling used in the power quality analyzer of FIG. 1.

FIG. 6 depicts a timing diagram 600 illustrating techniques for waveform sampling used in the PQ analyzer 100. In one embodiment, the input module 110 detects moments of time (x-axis 604) when polarity of a waveform 601 (y-axis 602) changes from negative to positive (i.e., when the rising waveform 601 crosses the x-axis 604) and produces a zero-crossing signal. Such moments are referred to as zero-crossing points and are denoted as $T_0$. A leading edge of the zero-crossing signal (not shown) coincides, in each cycle of the waveform 601, with the moments $T_0$. In the digitizing module 230, the ADCs are synchronized with the zero-crossing signal and generate data points 612 with periodicity determined be their respective sampling rates (as depicted, at moments $T_0$-$T_{11}$). Alternatively, the zero-crossing points may correspond to moments $T_6$, in which polarity of the waveform 601 changes from positive to negative.

Figure 7:
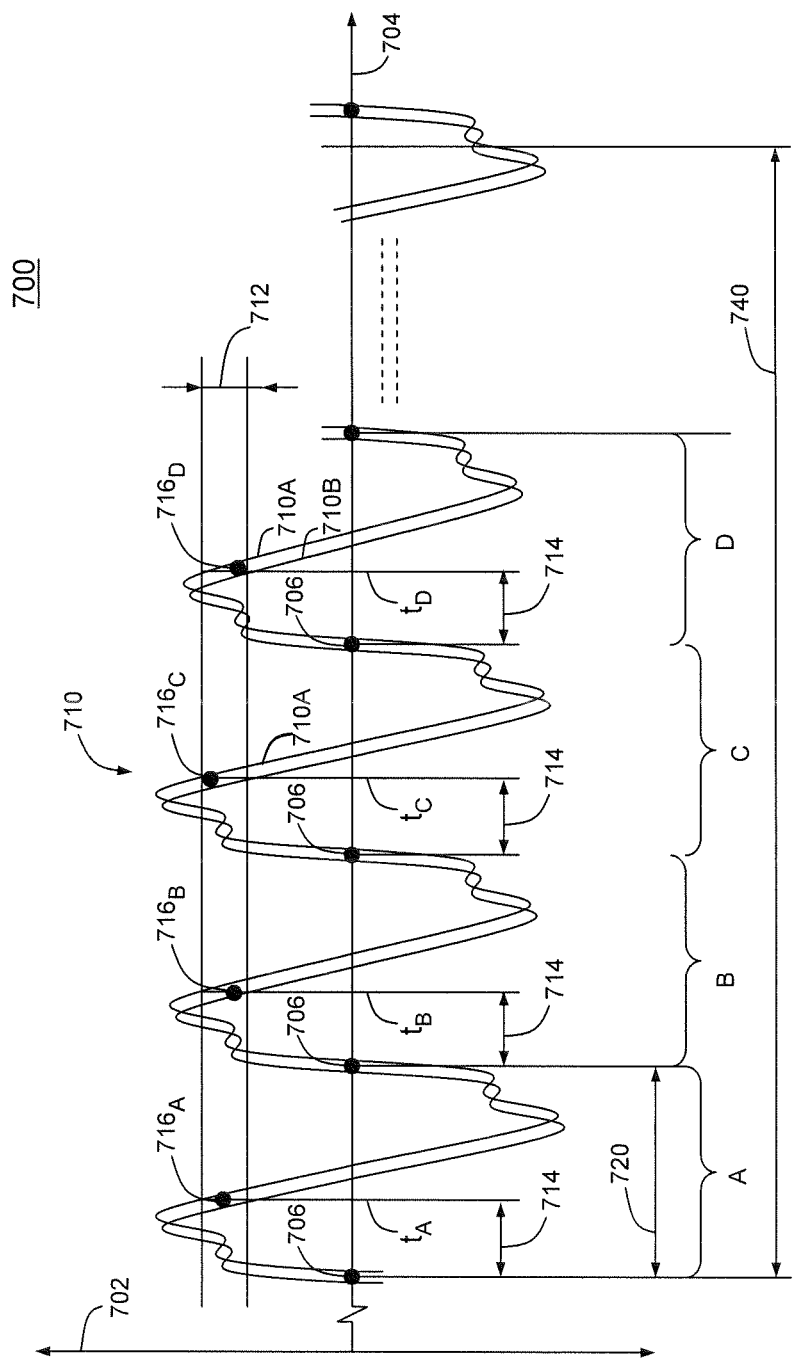
FIG. 7 is a timing diagram illustrating techniques for averaging data points used in the power quality analyzer of FIG. 1.

FIG. 7 is timing diagram 700 illustrating techniques for averaging data points used in the PQ analyzer 100. The timing diagram 700 depicts a waveform 710 of voltage (or current) (y-axis 702) as a function of time (x-axis 704). To show impact of analog noise associated with the waveform 710, the waveform is shown as a band having noise-defined boundaries $710_A$ and $710_B$. At any moment of time, a measured value is disposed in the respective portion of such a band. In the depicted embodiment, data points $716_A$-$716_D$ are measured at exemplary moments $t_A$-$t_D$ corresponding to the same phase angles in their respective AC cycles, and their numerical values are randomly disposed in a range 712, which is defined by the boundaries $710_A$ and $710_B$.

During consecutive AC cycles 720 of the waveform 710 (four AC cycles A-D are shown), pluralities of data points corresponding, in the respective AC cycles, to the same phase angles thereof are selectively measured and identified. Such data points are disposed, on the x-axis 704, at the same distances from the corresponding zero-crossing points 706, which are defined as discussed above in reference to FIG. 6. For example, in the depicted embodiment, data points $716_A$-$716_D$ correspond to the same phase angle and are disposed, in their respective AC cycles, at the same distances 714 away from the zero-crossing points 706.

Values Q of the data points $716_A$-$716_D$ are averaged for a pre-determined number m of cycles of the waveform 710, wherein m>1 (for example, four data points $716_A$-$716_D$ are averaged) or during a pre-determined time interval 740. Then, averaged values of the data points $716_A$-$716_D$ are used in the calculations performed in the processing module 120. In operation, averaging of consecutive data points corresponding to the same phase angles allows to suppress analog noise in the measurements of the monitored voltages and currents approximately by a factor of $\{(Q_1)^2+(Q_2)^2+ \ldots +(Q_m)^2\}^{1/2}$.

Figure 8:
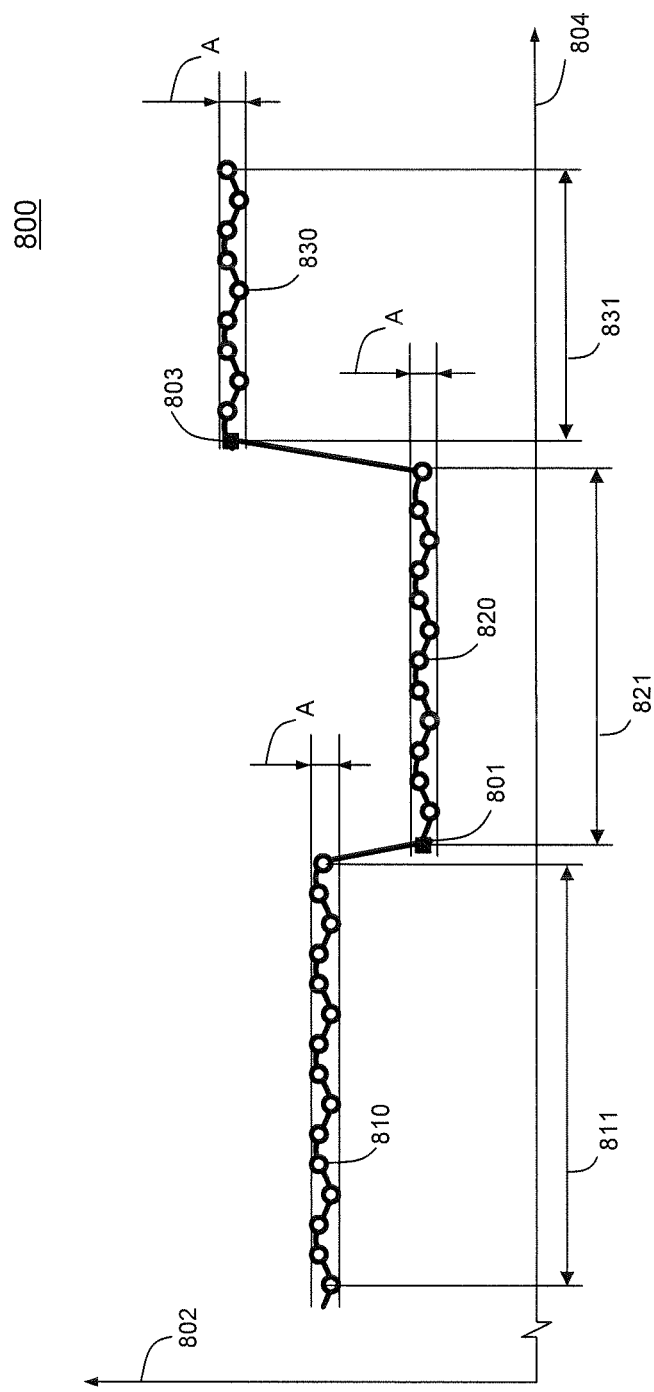
FIG. 8 is a timing diagram illustrating techniques for displaying data used in the power quality analyzer of FIG. 1.

FIG. 8 is a timing diagram illustrating techniques for displaying data used in the PQ analyzer 100. The timing diagram 800 depicts a plurality of data points 810, 820, and 830 depicting a value (y-axis 802) of an arbitrary parameter G as a function of time (x-axis 804). In operation, the PQ analyzer 100 accumulates a pre-determined number M of consecutive data points $DP_1$ through $DP_M$ of the parameter G, where M>1. Then, an average value $F_1$ of the data points $DP_1$ through $DP_M$ of the parameter G and a weighted average $F_2$ are calculated, wherein $F_1=(DP_1+DP_2+ \ldots +DP_M)/M$, $F_2=[(M-1)F_1+DP_{M+1}]/M$, and $DP_{M+1}$ is a consecutive (M+1) data point of the parameter G.

When $|F_2-DP_{M+1}|$ is equal to smaller than a pre-determined limit A (i.e., if $|F_2-DP_{M+1}|\leq A$), a value of the weighted average $F_2$ is displayed on the front panel display 132. Referring to FIG. 8, this condition is met during time intervals 811, 821, and 831. When $|F_2-DP_{M+1}|>A$, a value of the data point $DP_{M+1}$ is displayed on the front panel display 132 and adopted as the new average value $F_1$ in calculations of consecutive values of the weighted average $F_2$ for data points accumulated after the data point $DP_{M+1}$. Referring to FIG. 8, this condition is met at data points denoted using reference numerals 801 and 803. This technique allows filtering digital noise associated with the measurements and calculations of the displayed parameters G. In particular, a periodicity of calculating a consecutive value of the weighted average $F_2$ may be substantially greater then a refreshing rate of the display 132.

Figure 9:
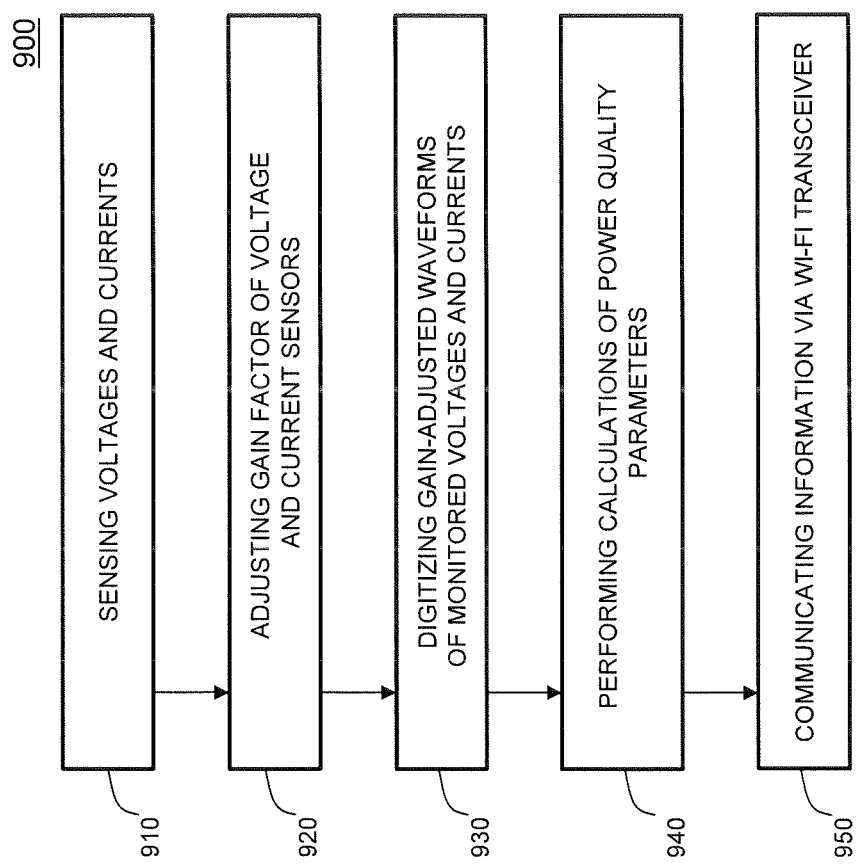
FIG. 9 is a flow chart illustrating a method of operating the power quality analyzer of FIG. 1.

FIG. 9 depicts a high-level flow diagram of a method 900 for operating the PQ analyzer 100 in accordance with one embodiment of the present disclosure. At step 910, monitored voltages and supply currents of the electrical service 101 are sensed using the voltage dividers 212 and currents sensors 214 of the input module 110. At step 920, using the gain control unit 230, gain factors of the voltage dividers and currents sensors are selectively adjusted and, at step 930, gain-adjusted waveforms of the monitored voltages and currents are digitized using the ADCs of the digitizing module 230.

At step 940, the PQ analyzer 100 analyzes waveforms of the monitored voltages and currents, and, using the processing module 120, performs calculations of power quality parameters thereof. At step 950, the results of these calculations are displayed on the front panel display 132 and, using component devices of the communications module 140 (for example, Wi-Fi transceiver 141), are transmitted to the respective addressee(s) of the PQ analyzer 100. Outgoing data transmissions may be performed on demand or with pre-determined periodicity, whereas alarms/incoming messages may be communicated during execution of any step of the method 900.

Figure 10:
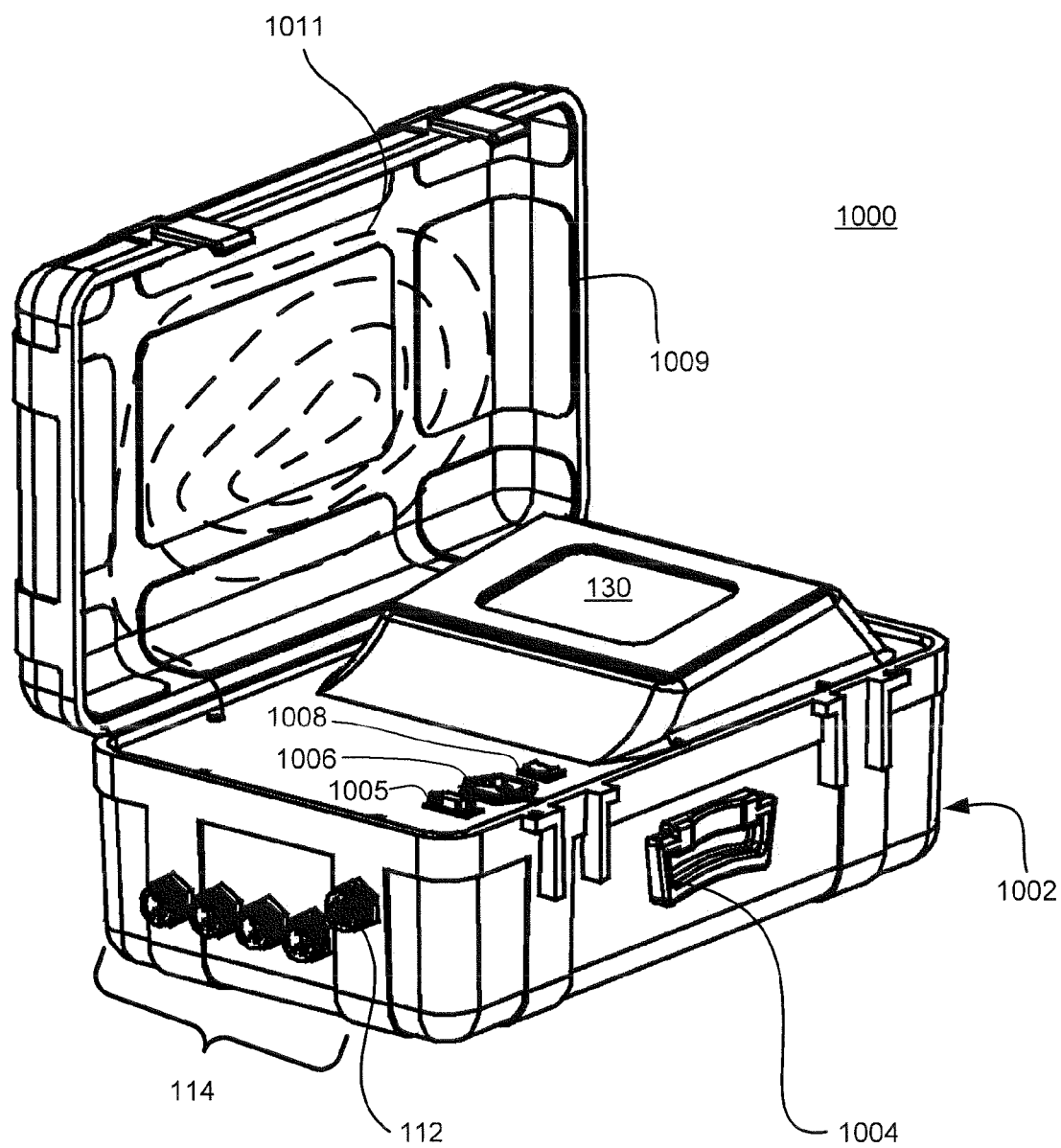
FIG. 10 is a perspective view of a portable power quality analyzer in accordance with another embodiment of the present disclosure.

In one embodiment, the PQ analyzer is disposed in a portable enclosure. Referring to FIG. 10, the PQ analyzer 1000 is constructed in a watertight enclosure 1002, e.g., a rugged carrying case, for housing the various components described above. The enclosure 1002 is watertight and outdoor rated (e.g., a NEMA 4 rated enclosure) and includes watertight input terminations for the voltage interface 112 and current interface 114. This enables the portable PQ analyzer 1000 to be used in harsh environments or outside the incoming utility feed to a building. Furthermore, the enclosure 1002 includes a handle 1004 for carrying the PQ analyzer 1000 from monitoring site to monitoring site.

In this embodiment, the user interface unit 130 is a touch screen graphical display, e.g., an LCD touch screen display. The touch screen display will enable a user to enter information such as setup parameters, calibration factors, limits, etc. The touch screen display allows real-time data to be displayed at the portable PQ analyzer 1000 easily and immediately without having to download the data to a computer or connecting the PQ analyzer 1000 to a computer. The touch screen display will also display various data recorded and calculated by the portable PQ analyzer 1000 such as voltage and current waveforms, harmonics, alarms, phasor diagrams, trending, etc. However, the PQ analyzer 1000 does include a RS232 download port 1005 for downloading and remote viewing of, for example, historical logs and other large volumes of data.

The portable PQ analyzer 1000 may be powered using two different methods, e.g., field powered and plug powered. The first method allows the PQ analyzer 1000 to be powered from a voltage line connection using two phase inputs via the voltage interface 112. The second method utilizes a wall plug for remotely powering the PQ analyzer 1000. The PQ analyzer 1000 includes a 120/220 volt plug receptacle 1006 for powering the PQ analyzer 1000 with a wall plug. Switch 1008 enables a user to select the power mode, e.g., line power connection or plug power connection.

Furthermore, the portable PQ analyzer 1000 will have a watertight connection for coupling the transmit/receive antenna 149 to the PQ analyzer 1000 when the enclosure or case 1002 is closed. In one embodiment, the antenna will be a wound, flat coil 1011 disposed on an upper cover 1009 of the case. In this manner, the antenna can be relatively long to increase its ability to pick-up wireless connection signals.

For example, as shown in FIG. 10 the antenna 1011 is wound to be disposed substantially over the entire surface area of the cover 1109, Additionally, with the antenna 1011 disposed under the upper cover 1009, the case 1002 can be closed while operational ensuring the contents of the enclosure or case 1002 are protected from the environment conditions.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. A portable power quality analyzer comprising:
a portable carrying case enclosure having an openable cover for enabling a user to access components within the portable carrying case enclosure when the cover is open, the portable carrying case enclosure including at least one voltage connection and at least one current connection accessible at an outer surface of the portable carrying case enclosure configured for temporary connection to at least one phase line of electrical services, the portable carrying case enclosure further including a handle attached to the outer surface configured for transportability of the portable carrying case enclosure from one monitoring site to another;
an input module disposed within the portable carrying case enclosure and coupled to the at least one voltage connection and the at least one current connection, the input module configured for monitoring waveforms of voltages and currents of the at least one phase line of the electrical services;
a processing module disposed within the portable carrying case enclosure and configured for processing the waveforms and determining power quality events;
a user interface unit disposed within the portable carrying case enclosure and accessible by the user only when the cover is open, the user interface unit including a display module configured to display voltage and current waveforms monitored by the input module and to display power quality events determined by the processing module;
a first communication module disposed within the portable carrying case enclosure for communicating over a first network, the communication module configured for wirelessly transmitting information from the portable power quality analyzer using at least one first wireless communication protocol and wirelessly receiving information into the portable power quality analyzer using the at least one first wireless communication protocol; and
a memory including code of a program to configure the portable power quality analyzer to operate as a server or a client of a second network,
wherein the first communication module is configured to receive wireless signal strength data from at least one other portable power quality analyzer and the processing module is configured to execute the code to operate as a server if a wireless signal strength of the portable power quality analyzer is greater than a wireless signal strength of the at least one other portable power quality analyzer.

2. The portable power quality analyzer of claim 1, wherein the at least one first wireless communication protocol is a Wi-Fi communication protocol.

3. The portable power quality analyzer of claim 1, wherein the at least one first wireless communication protocol is a SMS communication protocol.

4. The portable power quality analyzer of claim 1, wherein the user interface unit is a touch screen graphical display.

5. The portable power quality analyzer of claim 1, wherein the first network is the Internet and the second network is a mesh network.

6. The portable power quality analyzer of claim 5, wherein the second network operates in accordance with IEEE 802.15.4.

7. The portable power quality analyzer of claim 1, wherein said IED is compliant with at least one of TCP/IP and 10/100Base-T Ethernet, Modbus/TCP, Modbus, DNP 3.0, Hypertext Transfer Protocol (HTML), File Transfer Protocol (FTP), and/or Extensive Markup Language (XML) Protocol.

8. The portable power quality analyzer of claim 1, wherein the first network is at least one of a Wi-Fi network, a cellular network, an Intranet, a local area network (LAN), a wide area network (WAN), and/or the Internet.

9. The portable power quality analyzer of claim 1, wherein the first communication module is configured to transmit and receive information over the first network via e-mail messages.

10. The portable power quality analyzer of claim 1, wherein the processing module is configured to use Dynamic Host Configuration Protocol (DHCP) to assign an Internet address to the portable power quality analyzer.

11. The portable power quality analyzer of claim 1, wherein the second network is an ad hoc network.

12. The portable power quality analyzer of claim 10, wherein the ad hoc network is self-configuring.

* * * * *